(12) United States Patent
Iwasaki et al.

(10) Patent No.: US 6,489,648 B2
(45) Date of Patent: Dec. 3, 2002

(54) SEMICONDUCTOR DEVICE

(75) Inventors: Tomio Iwasaki, Tsukuba (JP); Hiroshi Moriya, Chiyoda (JP); Hideo Miura, Koshigaya (JP); Shuji Ikeda, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/944,485

(22) Filed: Aug. 30, 2001

(65) Prior Publication Data

US 2002/0113261 A1 Aug. 22, 2002

(30) Foreign Application Priority Data

Feb. 19, 2001 (JP) .......................... 2001-041098

(51) Int. Cl.[7] .................. H01L 27/108; H01L 29/76; H01L 29/94; H01L 31/119
(52) U.S. Cl. ............................. 257/310; 257/410
(58) Field of Search ................ 257/310, 410; 438/216, 261, 591

(56) References Cited

U.S. PATENT DOCUMENTS 6,060,755 A    5/2000  Ma et al.

FOREIGN PATENT DOCUMENTS

JP    53-113484    10/1978
JP    2000-243951    9/2000

OTHER PUBLICATIONS

"Devices Solution—LSI," *Nikkei Microdevices* (Feb. 2000), pp. 93–106.
Byoung Hun Lee, et al., "Ultrathin Hafnium Oxide with Low Leakage and Excellent Reliability for Alternative Gate Dielectric Application," IEEE International Electron Devices Meeting, No. 6.1 (1999), pp. 99–133 thru 99–136.
Wen–Jie Qi, et al., "MOSCAP and MOSFET Characteristics Using $ZrO_2$ Gate Dielectric Deposited Directly on Si," IEEE International Electron Devices Meeting, No. 6.4 (1999), pp. 99–145 thru 99–148.
Benito deCelis, et al., "Molecular Dynamics Dimulation of Crack Tip Processes in Alpha–iron and Copper," *J. Appl. Phys.* (Sep. 1983), 54(9):4864–78.
Thomas Kwok, et al., "Molecular–dynamics Studies of Grain–boundary Diffusion," *Physical Review B* (May 15, 1984), 29(10):5363–71.

*Primary Examiner*—Steven Loke
*Assistant Examiner*—Thien F. Tran
(74) *Attorney, Agent, or Firm*—Townsend and Townsend and Crew LLP

(57) ABSTRACT

A semiconductor device has a gate dielectric film formed of zirconium oxide or hafnium oxide as a chief material and a gate electrode film in contact with the gate dielectric film on one principal surface side of a silicon substrate. The gate dielectric film contains an addition element to prevent diffusion of oxygen.

2 Claims, 7 Drawing Sheets

SEMICONDUCTOR DEVICE

BACKGROUND OF THE INVENTION

The present invention relates to a semiconductor device, and more particularly to a semiconductor device using a material having a high dielectric constant.

With the progressive microminiaturization of components in semiconductor devices, of late it has been required that the gate of a transistor should be 0.15 µm in length and the gate dielectric film, if formed by $SiO_2$, for example, should be made as thin as 2 nm or less in thickness.

With dielectric films having such a thin thickness, a tunneling current that passes through them is so large as not to be negligible. A possible solution to this problem has been considered to increase the physical thickness of the dielectric film while maintaining the dielectric properties by using a dielectric material having a higher dielectric constant than that of $SiO_2$. Materials regarded as candidates for the above-mentioned material with high dielectric constant are zirconium oxide or hafnium oxide as is described in the 2000, February issue (pp.93–106) of Nikkei Microdevices, for example. However, zirconium oxide or hafnium oxide forms a layer of reaction compound with a thickness of about 1.5 nm ~2.5 nm at the interface with the silicon substrate as stated in the lecture papers (Lecture No. 6.1, pp.99–133, and Lecture No. 6.4, pp.145–148) of 1999 IEEE (THE INSTITUTE OF ELECTRICAL AND ELECTRONICS ENGINEERS) INTERNATIONAL ELECTRON DEVICES MEETING, for example.

Such reaction compounds are likely to degrade electrical characteristics.

SUMAMRY OF THE INVENTION

The present invention has as its object to prevent deterioration of the electrical characteristics and provide a semiconductor device with improved reliability.

After assiduous efforts made to obtain measures by which to make it harder for oxygen to diffuse from a dielectric film that includes zirconium oxide as the cheif component element, the inventors have found it effective to add hafnium or titanium to the zirconium oxide.

On the other hand, from arduous endeavor to obtain measures by which to make oxygen less likely to diffuse from a dielectric film that includes hafnium oxide as the chief component element, the inventors have found it effective to add titanium to the hafnium oxide.

Moreover, the inventors have found that electrode materials, which have little tendency to allow oxygen to diffuse at the interface with the dielectric film that includes zirconium oxide or hafnium oxide as the chief component element, are cobalt silicide and silicon.

Still further advantages of the present invention will become apparent to those of ordinary skill in the art upon reading and understanding the following detailed description of the preferred and alternate embodiments.

BRIEF DESCRIPTION OF THE DRAWINGS

The invention will be described in conjunction with certain drawings which are for the purpose of illustrating the preferred and alternate embodiments of the invention only, and not fur the purpose of limiting the same, and wherein.

DESCRIPTION OF THE EMBODIMENTS

Figure 1:
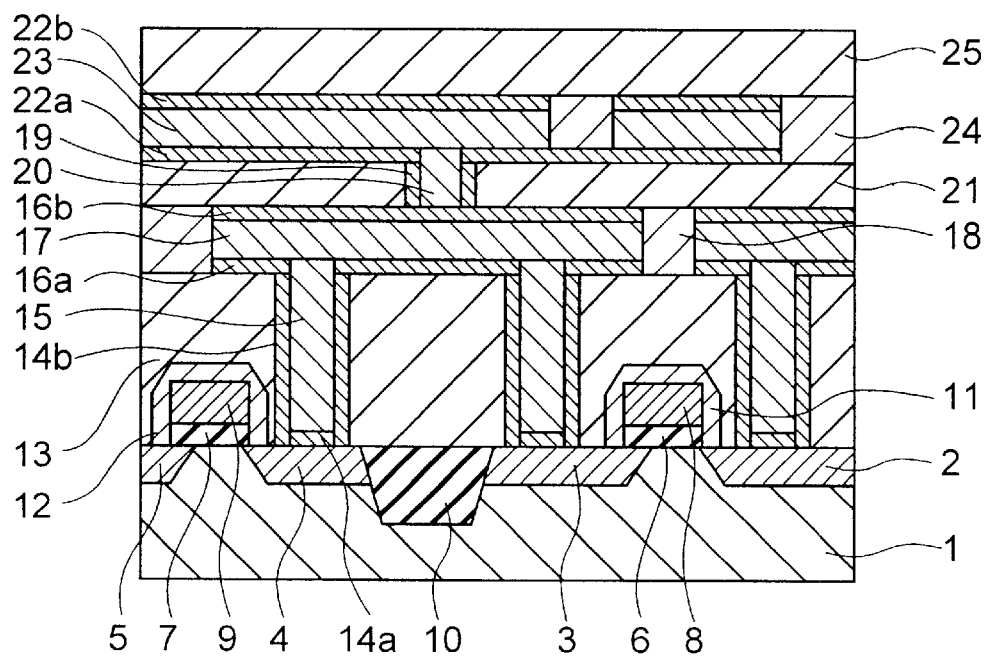
FIG. 1 shows a structure in a cross section of the principal part of a semiconductor device according to a first embodiment of the present invention.

The object of the present invention is solved by a semiconductor device of a structure described as follows.

(1) A semiconductor device comprises a semiconductor substrate, a gate dielectric film formed of zirconium oxide as a chief material on one principal surface side of the semiconductor substrate, and a gate electrode film formed on the gate dielectric film, wherein the gate dielectric film contains not less than 0.04 at. % and not more than 12 at. % of hafnium.

Preferably, the chief material of the gate electrode film is cobalt silicide or silicon.

(2) A semiconductor device comprises a semiconductor substrate, a gate dielectric film formed of zirconium oxide as a chief material on one principal surface side of the semiconductor substrate, and a gate electrode film formed on the gate dielectric film, wherein the gate dielectric film contains not less than 0.02 at. % and not more than 8 at. % of titanium.

Preferably, the chief material of the gate electrode film is cobalt silicide or silicon.

(3) A semiconductor substrate comprises a semiconductor substrate, a gate dielectric film formed of hafnium oxide as a chief material on one principal surface side of the semiconductor substrate, and a gate electrode film formed on the gate dielectric film, wherein the gate dielectric film contains not less than 0.03 at. % and not more than 10 at. % of titanium.

Preferably, the chief material of the gate electrode film is cobalt silicide or silicon.

(4) A semiconductor device has formed on one principal surface of a semiconductor substrate a first capacitance electrode, a capacitance dielectric film formed of zirconium oxide as a chief material in contact with the first capacitance electrode, and a second capacitance electrode formed in contact with the capacitance dielectric film, wherein the capacitance dielectric film contains not less than 0.04 at. % and not more than 12 at. % of hafnium, and wherein at least one of the first and the second capacitance electrodes contains cobalt silicide or silicon as a chief material.

(5) A semiconductor device has formed on one principal surface of a semiconductor substrate a first capacitance electrode, a capacitance dielectric film formed of zirconium oxide as a chief material in contact with to the first capacitance electrode, and a second capacitance electrode formed in a manner adjacent to the capacitance dielectric film, wherein the capacitance dielectric film contains not less than 0.02 at. % and not more than 8 at. % of titanium, and wherein at least one of the first capacitance electrode and the second capacitance electrode contains cobalt silicide or silicon as a chief material.

(6) A semiconductor device has formed on one principal surface of a semiconductor substrate a first capacitance electrode, a capacitance dielectric film formed of hafnium oxide as a chief material in contact with the first capacitance electrode, and a second capacitance electrode formed in a manner adjacent to the capacitance dielectric film, wherein the capacitance dielectric film contains not less than 0.03 at. % and not more than 10 at. %, and wherein at least one of the first and the second capacitance electrodes contains cobalt silicide or silicon.

Meanwhile, the above-mentioned reaction compound at the interface between the silicon substrate and the zirconium oxide or the hafnium oxide was formed as oxygen diffused from the zirconium oxide or hafnium oxide into the silicon substrate, which means that loss of oxygen occurs in the zirconium oxide or hafnium oxide. This oxygen loss gives rise to deterioration of the characteristics of the gate dielectric film. Further, oxygen loss also may occur when oxygen diffuses from the gate dielectric film, made chiefly of zirconium oxide or hafnium oxide, into the gate electrode, which causes deterioration of characteristics.

Not only at the gate region of transistors, also at the memory capacitor region of semiconductor memories, the capacitance dielectric film has come to be formed by materials having high dielectric constants attending on microminiaturization, and here again, zirconium oxide and hafnium oxide are drawing attention as alternative gate dielectric materials. However, like in the above example, oxygen loss may occur by oxygen diffusing from the capacitance dielectric film, chiefly made of zirconium oxide or hafnium oxide, into the capacitance electrode, which is likely to cause a decrease (deterioration) in its characteristics, such as a capacity decrease.

According to the present invention, it is possible to restrict the deterioration of electrical characteristics and provide a semiconductor device that has improved reliability and therefore realizes high yield.

More specifically, referring to a semiconductor device that adopts a gate structure according to the present invention, it is possible to a semiconductor device of a gate structure that is resistive to diffusion of oxygen at the interface with the silicon substrate. It is also possible to provide a semiconductor device of a gate structure that is resistive to diffusion of oxygen at the interface between the gate dielectric film and the gate electrode. With regard to a semiconductor device that adopts a memory capacitor structure according to the present invention, it is possible to provide a semiconductor device having a memory capacitor structure that is resistive to diffusion of oxygen at the interface between the capacitance dielectric film and the capacitance electrode.

According to known examples inquired in conjunction with the structure of the present invention, various elements have been listed in JP-A53-113484, JP-A-2000-243951 and U.S. Pat. No. 6060755, but there have been no disclosure about zirconium, hafnium or combinations of these elements with titanium as in the present application.

Preferred embodiments of the present invention will be described with reference to the accompanying drawings.

FIG. 1 shows a sectional view of a principal portion of the semiconductor device according to a first embodiment of the present invention. As shown in FIG. 1, the semiconductor devices according to the first embodiment are MOS transistors that have diffused layers 2, 3, 4 and 5 formed on a silicon substrate 1, and further has gate dielectric films 6 and 7 and gate electrodes 8 and 9 formed on the diffused layers and the silicon substrate. The gate dielectric films 6 and 7 are formed of zirconium oxide or hafnium oxide as their chief material to meet demands for microminiaturization and advanced functions. The gate dielectric films 6 and 7 are formed by chemical vapor deposition (CVD) or sputtering, for example.

During heat-treatment in the fabrication process of a semiconductor device shown in FIG. 1, oxygen tends to diffuse from zirconium oxide ($ZrO_2$) or hafnium oxide ($HfO_2$) as the chief material of the gate dielectric films 6 and 7 into the silicon substrate 1 and the gate electrodes 8 and 9. If $ZrO_2$ is used as the chief material of the gate electrodes 6 and 7 to prevent diffusion of oxygen from the gate electrodes 6 and 7, hafnium or titanium is contained as an addition element in the gate dielectric films 6 and 7. If $HfO_2$ is used as the chief material to the gate dielectric films 6 and 7, titanium is contained as an addition element in the gate dielectric films 6 and 7.

Preferably, as the chief material of the gate electrodes 8 and 9, cobalt silicide or silicon should be used, which is resistive to diffusion of oxygen from the gate dielectric films 6 and 7 during heat treatment. The gate electrodes 8 and 9 are formed by CVD, sputtering or the like.

The MOS transistors are separated from each other by isolation film 10. Dielectric films 11 and 12 made of silicon oxide, for example, are disposed on the top of and at side walls of the gate electrodes 8 and 9. The MOS transistors are covered on whole top surfaces with, for example, a BPSG (Boron-doped Phospho Silicate Glass) film or a SOG (Spin On Glass) film or a dielectric film 13 made of silicon oxide or nitride formed by CVD or sputtering. Plugs formed by a main conductive film 15 and covered with adjacent conductive films (first conductive film) 14a and 4b for diffusion prevention are formed in contact holes formed in the dielectric film 13. Those plugs are connected to the diffused layers 2, 3, 4 and 5. A first stacked wiring made of a conductive film 17 covered with diffusion-preventive adjacent conductive films 16a and 16b is connected to the plugs.

The stacked wiring is obtained, for example, by first depositing the adjacent conductive film 16a by sputtering or the like, then forming the main conductive film 17 by sputtering or the like and on top of this, forming the adjacent conductive film 16b by sputtering, for example, and forming a wiring pattern by etching. On top of the first stacked wiring, a plug formed by a main conductive film 20 covered with an adjacent conductive film 19 is formed in a contact hole bored in a dielectric film 21, and the plug is connected to the first stacked wiring. The plug 20 is connected to a second stacked wiring formed by a main conductive film 23 covered with adjacent conductive films 22a and 22b.

The second stacked wiring is obtained, for example, by depositing the adjacent conducting film 22a by, say, sputtering, forming the main conductive film 23 by sputtering, for example, and on top of this, forming the adjacent conductive film 22b by sputtering, for example, and forming a wiring pattern by etching or the like.

Description will be made of an oxygen diffusion inhibiting effect in the present embodiment. To give a detailed description of the effect of the present embodiment, here is shown an example of analysis by molecular dynamics simulation. According to the description in the 54th volume (issued in 1983) of JOURNAL OF APPLIED PHYSICS, pp. 4864-4878, for example, molecular dynamic simulation is a method for calculating forces acting on atoms through inter-atom potentials and calculating positions of atoms at different times by solving Newton's equation of motion.

In the present embodiment, by calculating interactions among different kinds of elements by introducing charge transfer into the above-mentioned molecular dynamic method, the following relation could be obtained.

The main effect of the present embodiment is that the addition element included in the gate dielectric film inhibits oxygen from diffusing from the gate dielectric film into the silicon substrate. Another effect of the present embodiment is that the addition element included in the gate dielectric film inhibits oxygen from diffusing from the gate dielectric film into the gate electrodes. The effects of the present embodiment can be analyzed by calculating oxygen diffusion coefficients and comparing its values whether an addition element is added or not. A method of calculating diffusion coefficients by molecular dynamic simulation is described in the 29th volume (issued in 1984) of Physical Review B, pp.5363-5371, for example.

Figure 2:
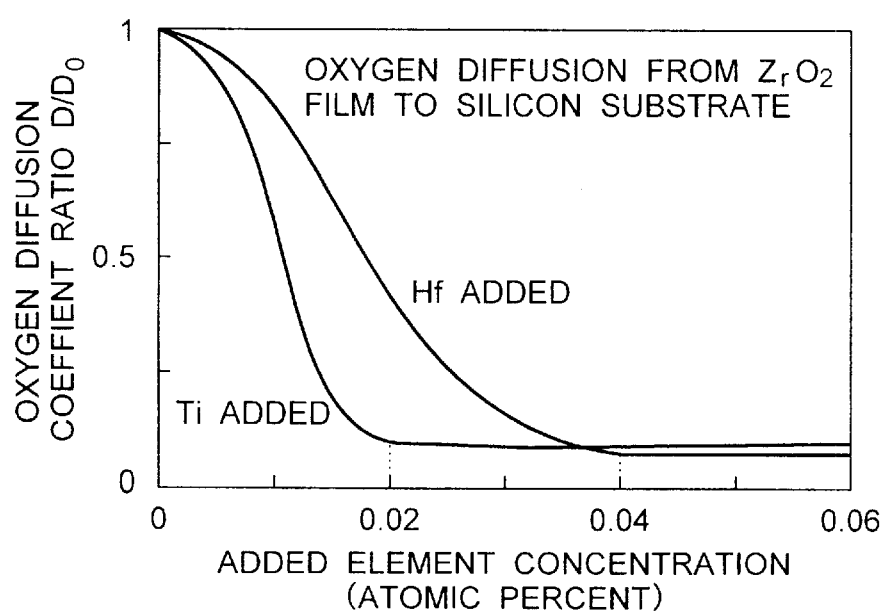
FIG. 2 shows, in a region where the addition concentration is low, an oxygen diffusion coefficient at 300° C. when oxygen diffuses from a 3 nm-thick zirconium oxide film according to the present invention into the silicon substrate.
Figure 3:
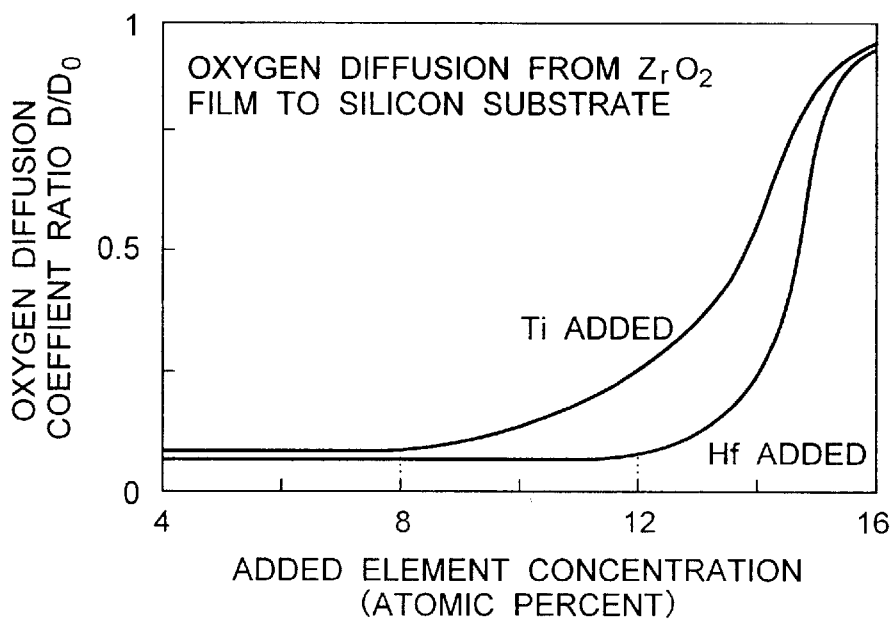
FIG. 3 shows, in a region where the addition concentration is high, an oxygen diffusion coefficient at 300° C. when oxygen diffuses from a 3 nm-thick zirconium oxide film according to the present invention into the silicon substrate.

One effect of the present embodiment is shown by describing an example of calculation in which a structure having a 3 nm-thick gate dielectric film formed on the (001) plane of a silicon substrate with a thickness of 10 nm is used as an analysis model. FIGS. 2 and 3 show the results of calculation of ratios $D/D_0$ of oxygen diffusion coefficient when oxygen in $ZrO_2$ (gate dielectric film) diffused into the silicon substrate at 300° C. The Do denotes a diffusion coefficient of oxygen when an addition element was not included in the gate dielectric film. FIG. 2 represents results showing the addition concentration dependency of $D/D_0$ in a low concentration region. More specifically, the diffusion coefficients of oxygen at 300° C. are shown in the low concentration region when the oxygen of the 3 nm-thick $ZrO_2$ according to the present invention diffused into the silicon substrate.

FIG. 3 represents results showing the addition concentration dependency of $D/D_0$ in a high concentration region. In other words, the diffusion coefficients of oxygen at 300° C. are shown in the high concentration region when the oxygen of the 3 nm-thick $ZrO_2$ according to the present invention diffused into the silicon substrate. It is understood from FIG. 2 that by adding not less than 0.04 at. % of hafnium to the $ZrO_2$, a conspicuous effect was obtained that the diffusion coefficients decreased to about $1/13$ of the value when no addition was added. It is also understood that by adding not less than 0.02 at. % of titanium to $ZrO_2$, a conspicuous effect was obtained that the diffusion coefficients decreased to about $1/11$ of the value when no addition was added. As can be seen from FIG. 3, the above-mentioned effect begins to become weak when the concentration of added hafnium is higher than 12 at. %. Obviously, the effect begins to decrease when the concentration of added titanium is higher than 8 at. %. Therefore, the diffusion of oxygen can be decreased by adding not less than 0.04 at. % and not more than 12 at. % of hafnium or not less than 0.02 at. % and not more than 8 at. % of titanium to a film formed by $ZrO_2$ as the chief component element. The above-mentioned effects can be achieved in a similar fashion even if conditions, such as film thickness or temperature, are changed. A limited degree of effect, though smaller than mentioned above, can be obtained by adding not less than 0.02 at. % and not more than 14 at. % of hafnium. A similar effect can be achieved by addition of not less than 0.015 at. % and not more than 0.12 at. % of titanium.

Figure 4:
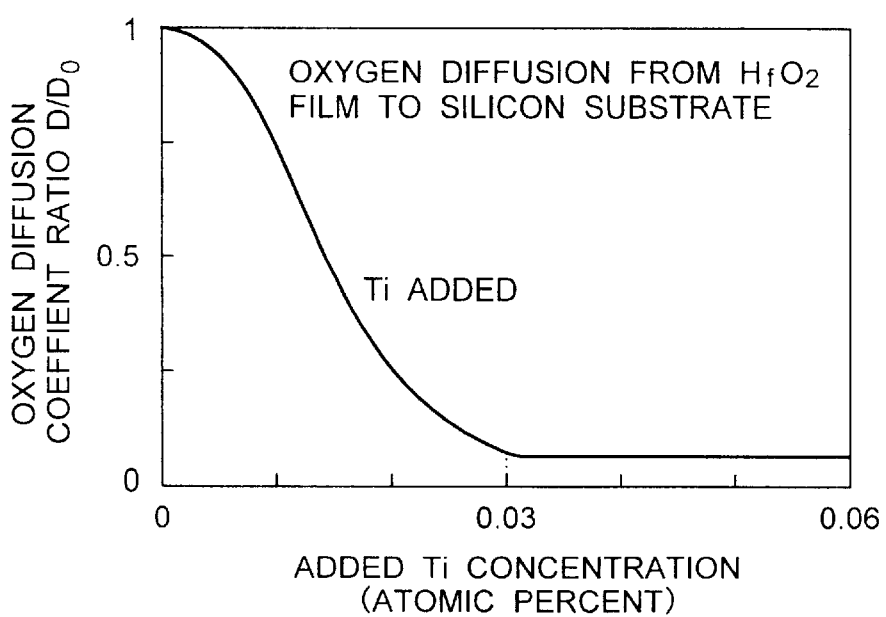
FIG. 4 shows, in a region where the addition concentration is low, an oxygen diffusion coefficient at 300° C. when oxygen diffuses from a 3 nm-thick hafnium oxide film according to the present invention into the silicon substrate.
Figure 5:
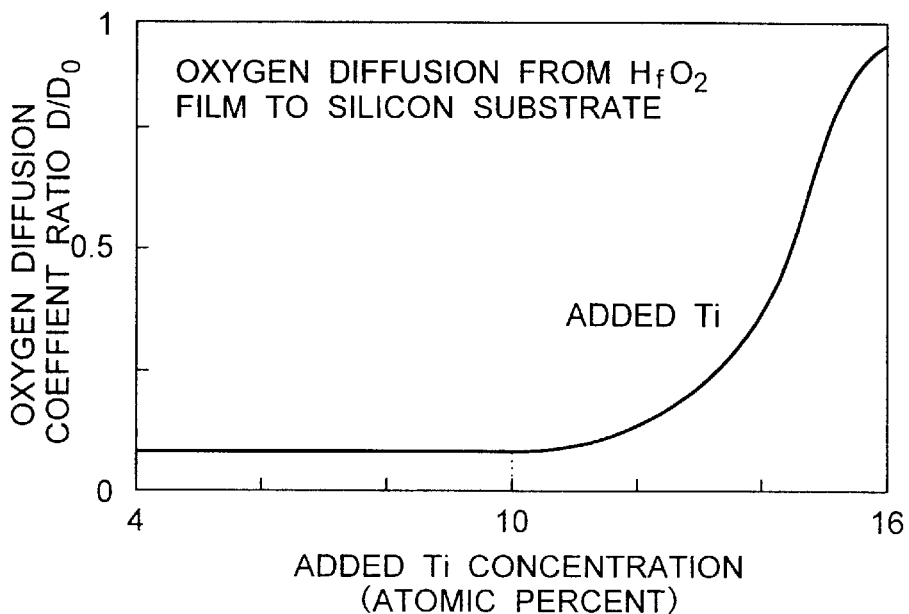
FIG. 5 shows, in a region where the addition concentration is high, an oxygen diffusion coefficient at 300° C. when oxygen diffuses from a 3 nm-thick hafnium oxide film according to the present invention into the silicon substrate.

FIGS. 4 and 5 show the results of calculation, by using the same analysis model, of ratios $D/D_0$ of oxygen diffusion coefficient when oxygen of $HfO_2$ (gate dielectric film) diffused into the silicon substrate, where $D_0$ denotes a diffusion coefficient of oxygen when no addition was added. FIG. 4 shows the addition concentration dependency of $D/D_0$ in a low concentration region. In other words, the diffusion coefficients of oxygen at 300° C. are shown in the low concentration region when the oxygen of the 3 nm-thick $HfO_2$ according to the present invention diffused into the silicon substrate. FIG. 5 shows the addition concentration dependency of $D/D_0$ is shown in the high concentration region. In other words, the diffusion coefficients of oxygen at 300° C. are shown in the high concentration region when the oxygen of the 3 nm-thick $HfO_2$ according to the present invention diffused into the silicon substrate. It can be seen from FIG. 4 that a notable effect was obtained that by adding not less than 0.03 at. % of titanium to $HfO_2$, the diffusion coefficients decreased to about $1/13$ of the value when no addition was added. It can be seen from FIG. 5 that the above-mentioned effect begins to become weak when the added titanium concentration is higher than 10 at. %. Therefore, the oxygen diffusion can be decreased by adding titanium in concentrations of not less than 0.03 at. % and not more than 10 at. %. Those effects can be achieved in a similar fashion even if conditions, such as film thickness or temperature, are changed.

Figure 6:
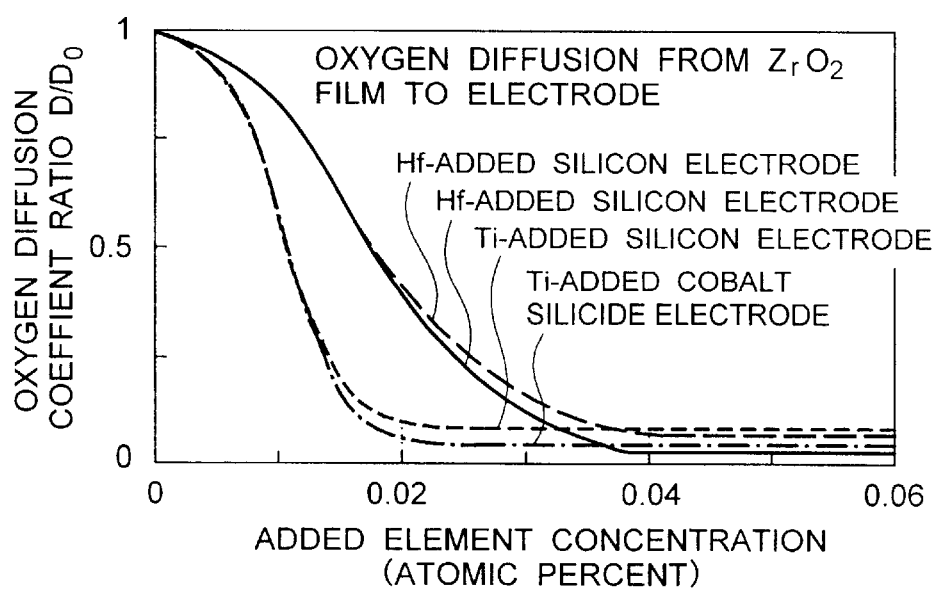
FIG. 6 shows, in a region where the addition concentration is low, an oxygen diffusion coefficient at 300° C. when a structure, which has a 3 nm-thick electrode film formed on a 3 nm-thick zirconium oxide film according to the present invention, was used as an analysis model.
Figure 7:
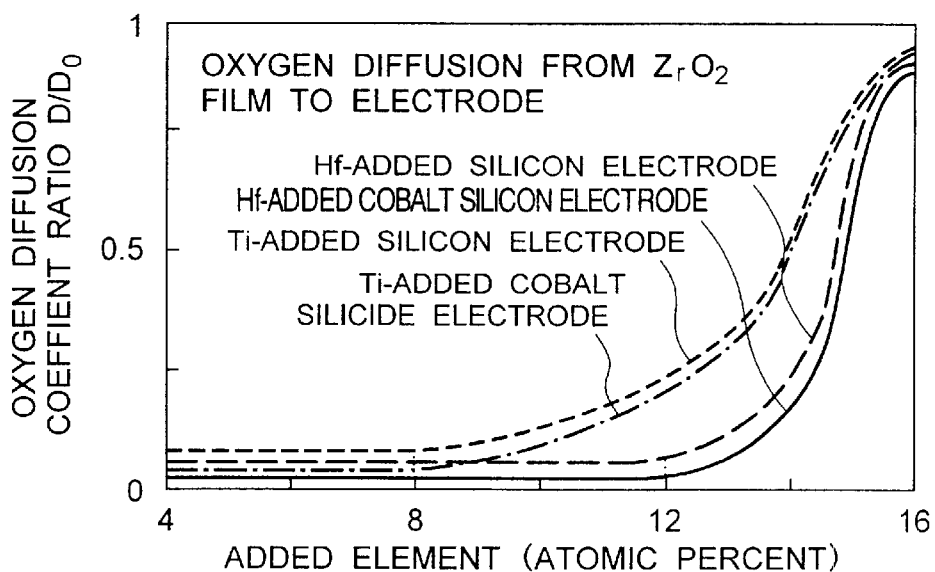
FIG. 7 shows, in a region where the addition concentration is high, an oxygen diffusion coefficient at 300° C. when a structure, which has a 3 nm-thick electrode film formed on a 3 nm-thick zirconium oxide film according to the present invention, was used as an analysis model.

Description will next be made of a case of molecular dynamic analysis to show another effect of the present invention that the diffusion of oxygen from the gate dielectric film to the gate electrode is inhibited by an element added to the gate dielectric film. More specifically, a case is shown in which a diffusion coefficient of oxygen at 300° C. was calculated by using a structure, which has a 3 nm-thick electrode film formed on a 3 nm-thick gate dielectric film, as an analysis model. FIGS. 6 and 7 show calculation results when $ZrO_2$ was used as the gate dielectric film and a cobalt silicide film or a silicon film was used as the gate electrode, where $D_0$ denotes a diffusion coefficient of oxygen when no addition was added. FIG. 6 represents results showing the addition concentration dependency of $D/D_0$ in a low concentration region. In other words, the diffusion coefficients of oxygen at 300° C. are shown in the low addition concentration region, calculated by using a structure, which has a 3 nm-thick electrode film formed on a 3 nm-thick $ZrO_2$ film according to the present invention as an analysis model. FIG. 7 represents results showing the addition concentration dependency of $D/D_0$ in a high concentration region. In other words, the diffusion coefficients of oxygen at 300° C. are shown in the high addition concentration region, calculated by using a structure, which has a 3 nm-thick electrode film formed on a 3 nm-thick $ZrO_2$ film according to the present invention, as an analysis model. From FIG. 6, like in FIG. 2, it is understood that a conspicuous effect was obtained that by adding not less than 0.04 at. % of hafnium to the $ZrO_2$ film, the diffusion coefficients decreased to about $1/13$ or less of the value when no addition was added. Further, it is understood that another conspicuous effect was obtained that by adding not less than 0.02 at. % of titanium to the $ZrO_2$ film, the diffusion coefficients decreased to about $1/12$ or less of the value when no addition was added. From FIG. 7, as in FIG. 3, it is known that the above-mentioned effect that the diffusion coefficients are decreased begins to lessen when the addition concentration of hafnium is higher than 12 at. %. Also, it is known that the effect begins to decrease when the addition concentration of titanium is higher than 8 at. %. Therefore, the diffusion of oxygen can be decreased by adding not less than 0.04 at. % and not more than 12 at. % of hafnium or not less than 0.02 at. % and not more than 8 at. % of titanium to the film that includes $ZrO_2$ as the chief component element. The above-mentioned effects can be achieved in a similar fashion even if conditions, such as film thickness or temperature, are changed.

Figure 8:
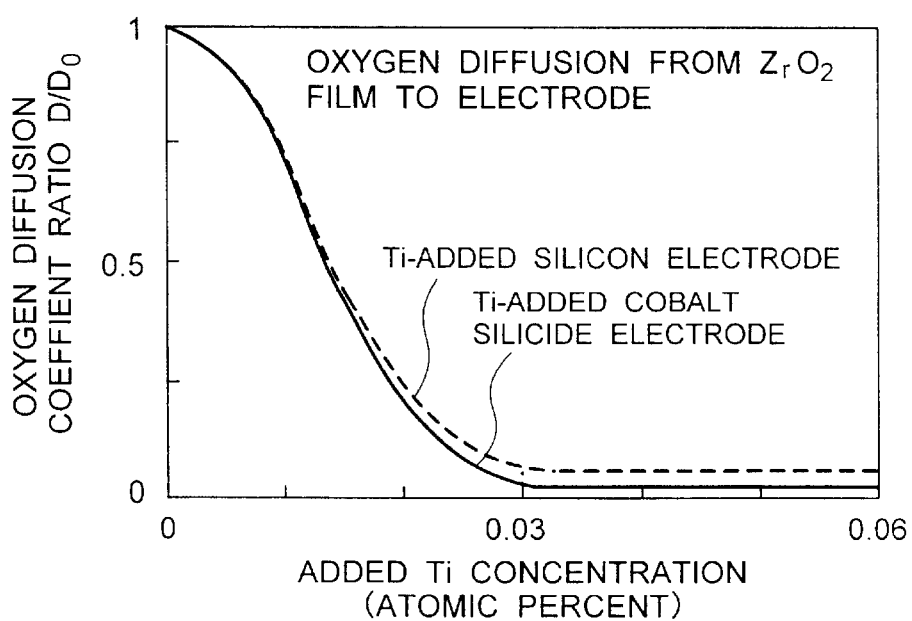
FIG. 8 shows, in a region where the addition concentration is low, an oxygen diffusion coefficient at 300° C. when a structure, which has a 3 nm-thick electrode film formed on a 3 nm-thick hafnium oxide film according to the present invention, was used as an analysis model.
Figure 9:
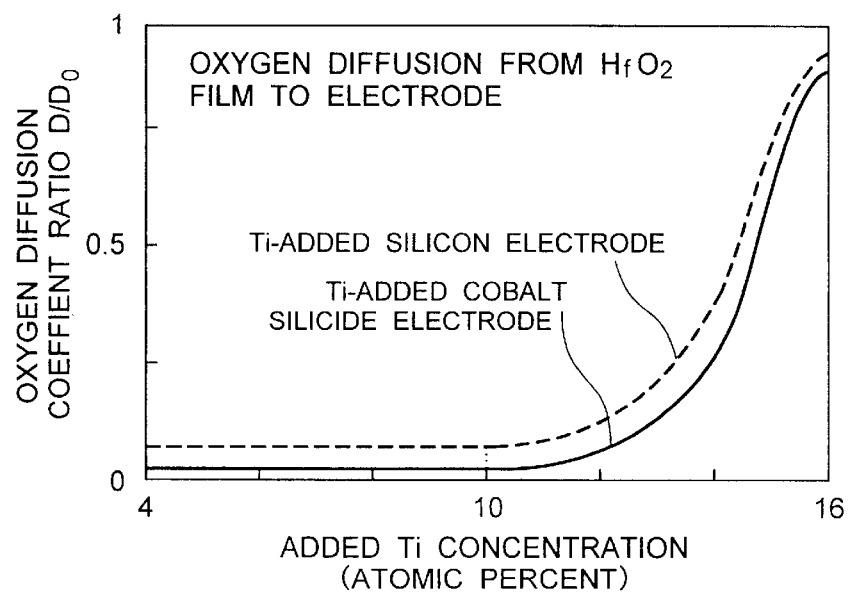
FIG. 9 shows, in a region where the addition concentration is high, an oxygen diffusion coefficient at 300° C. when a structure, which has a 3 nm-thick electrode film formed on a 3 nm-thick hafnium oxide film according to the present invention, was used as an analysis model.

FIGS. 8 and 9 show results when $HfO_2$ was used for the gate dielectric film and a cobalt silicide film or a silicon film was used for the gate electrode in the same analysis model as mentioned above, where $D_0$ was a diffusion coefficient when no addition element was used. FIG. 8 represents results showing the addition concentration dependency of $D/D_0$ in a low concentration region. In other words, the diffusion coefficients of oxygen at 300° C. are shown in the low addition concentration region, calculated by using a structure, which has a 3 nm-thick electrode film formed on a 3 nm-thick $HfO_2$ film according to the present invention as an analysis model. FIG. 9 represents results showing the addition concentration dependency of $D/D_0$ in a high concentration region. In other words, the diffusion coefficients of oxygen at 300° C. are shown in the addition concentration region, calculated by using a structure, which has a 3 nm-thick electrode film formed on a 3 nm-thick $HfO_2$ according to the present invention, as an analysis model. From FIG. 8, like in FIG. 4, it is evident that a notable effect can be achieved that by adding not less than 0.03 at. % of titanium to the $HfO_2$ film, the diffusion coefficients decreased to about $1/13$ or less of the value when no addition element was added. From FIG. 9, like in FIG. 5, those effects appear to lessen when the addition concentration of titanium is higher than 10 at. %. Therefore, the diffusion of oxygen can be decreased by adding titanium in concentrations of not less than 0.03 at. % and not more than 10 at. % to the film including $HfO_2$ as the chief component element. Those effects can be achieved in a similar manner even if conditions, such as film thickness or temperature, are changed.

Figure 10:
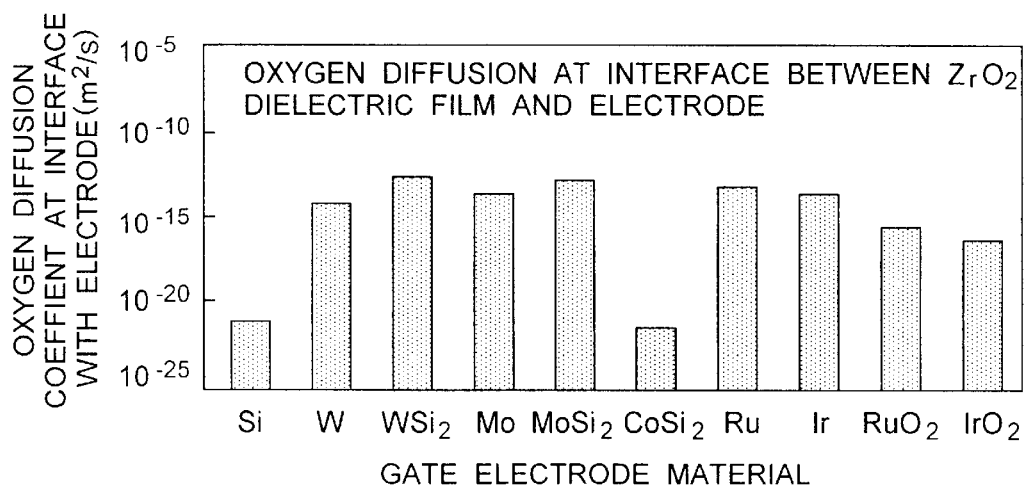
FIG. 10 shows oxygen diffusion coefficients for various electrode materials when a structure, which has a 3 nm-thick electrode film formed on a 3 nm-thick zirconium oxide according to the present invention was used as an analysis model.
Figure 11:
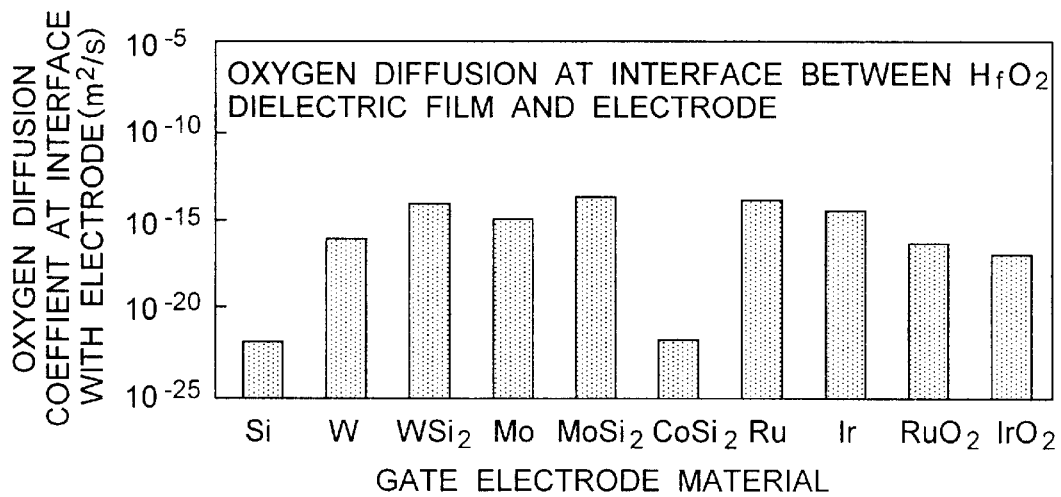
FIG. 11 shows oxygen diffusion coefficients for various electrode materials when a structure, which has a 3 nm-thick electrode film formed on a 3 nm-thick hafnium oxide according to the present invention was used as an analysis model.

In the foregoing calculation examples, a cobalt silicide film or a silicon film has been used for the gate electrodes, but even if other materials are used, similar effects can be achieved. However, the fact that cobalt silicide or silicon is a desirable material for gate electrodes is endorsed by a calculation as follows. FIGS. 10 and 11 show the results of calculation of oxygen diffusion coefficients for various electrode materials by using a structure, which has a 3 nm-thick electrode film formed on a 3 nm-thick gate dielectric film, as an analysis model. The values represented by bars denote diffusion coefficients of oxygen at 300° C. when no addition element was added. FIG. 10 shows results when the gate dielectric film was formed of $ZrO_2$. More specifically, the oxygen diffusion coefficients are shown for various electrode materials, calculated by using a structure, which has a 3 nm-thick electrode film formed on a 3 nm-thick $ZrO_2$ as an analysis model.

FIG. 11 shows results when the gate dielectric film was formed of $HfO_2$. In other words, the oxygen diffusion coefficients are shown for various kinds of electrode materials, calculated by using a structure, which has a 3 nm-thick electrode film formed on a 3 nm-thick $HfO_2$ film according to the present invention.

As is apparent from FIGS. 10 and 11, the diffusion coefficients when the gate electrodes were formed of cobalt silicide or silicon are remarkably smaller than when other materials were used for the gate electrodes. Therefore, preferably, cobalt silicide or silicon should be used for the gate electrodes for the purpose of reducing the diffusion of oxygen.

Figure 12:
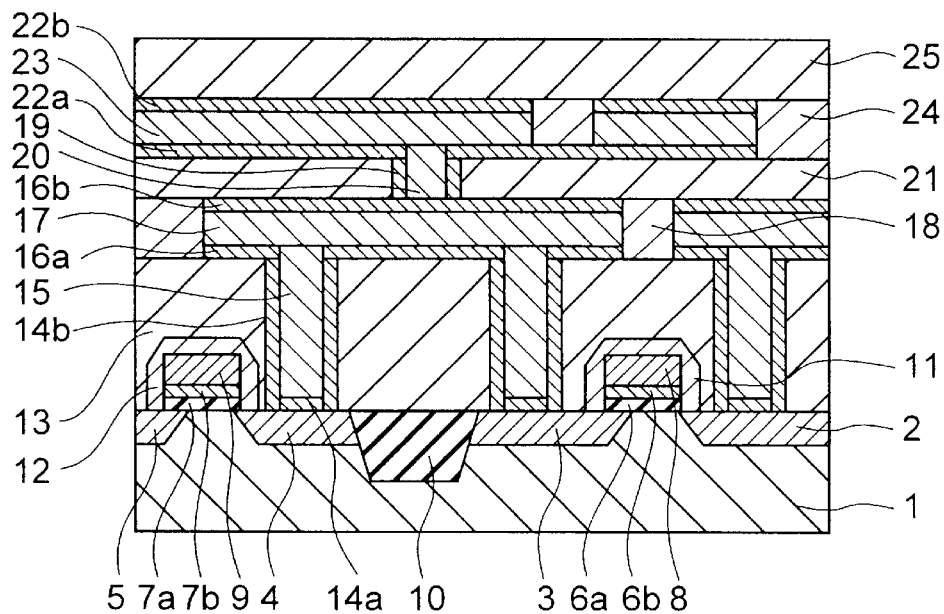
FIG. 12 shows a structure in a sectional view of the principal part of a semiconductor device according to a second embodiment of the present invention.

FIG. 12 shows the structure in a cross section of the principal portion of a semiconductor device according to a second embodiment of the present invention. A major difference of the second embodiment from the first embodiment is that the gate dielectric films are each formed in a two-layer structure, including a first gate dielectric film 6a or 7a and a second gate dielectric film 6b or 7b. For the second gate dielectric films 6b and 7b, $ZrO_2$ or $HfO_2$ is used as the chief material to meet demands for miniaturization and high-level function. For the first gate dielectric films 6a and 7a, silicon oxide, zirconia silicate, or hafnium silicate, for example, is used as the chief material. Thus, the second gate dielectric films 7b and 7b have improved thermal stability. Though not illustrated, the gate dielectric films may have a structure of three or more layers. For example, if the gate dielectric film is in a three-layer structure, preferably, the first and second gate dielectric films are formed as described above and the third gate dielectric film is formed as a Si-containing layer. For example, the third gate dielectric film is formed of the same material as that of the first gate dielectric film, so that the thermal stability can be further improved.

Figure 13:
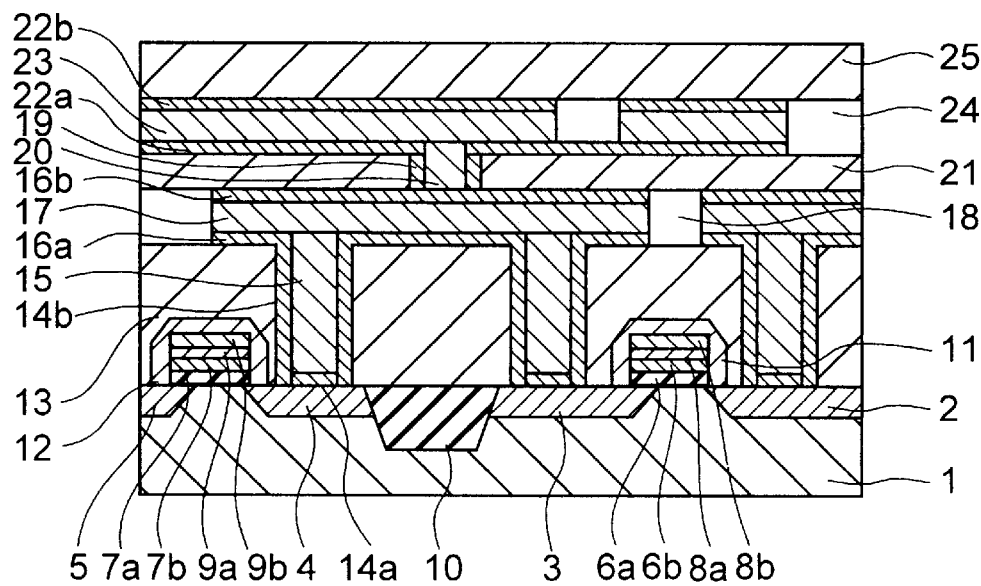
FIG. 13 is a sectional view of the principal part of a semiconductor device according to a third embodiment of the present invention.

FIG. 13 shows a structure in a sectional view of the principal portion of a semiconductor device according to a third embodiment of the present invention. The major difference of the third embodiment from the second embodiment is that the gate electrode films are each formed in a two-layer structure including a first gate electrode film 8a or 9a and a second gate electrode film 8b or 9b. The first gate electrode films 8a and 9a should preferably be formed of cobalt silicide or silicon as the chief material, which has little tendency to allow oxygen to diffuse through. The second gate electrode films 8b and 9b should preferably be formed of a metal film, such as tungsten or molybdenum, for example, to reduce the electric resistance of the whole gate electrodes. In this case, though not illustrated, another conductive layer may exist between the first gate electrode films 8a and 9a and the second gate electrode films 8b and 9b. For this conductive film, it is preferable to use a film, such as TiN or WN, which is effective in preventing interdiffusion between the first gate electrode films 8a and 9a and the second gate electrode films 8b and 9b.

Figure 14:
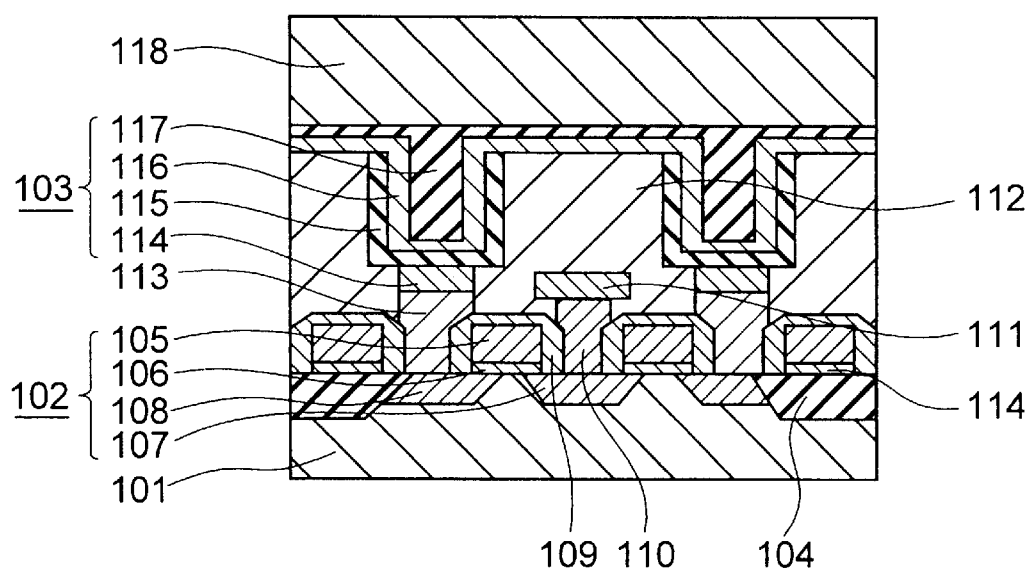
FIG. 14 is a sectional view of the principal part of a semiconductor device according to a fourth embodiment of the present invention.

FIG. 14 shows a structure in a sectional view of memory cells in a semiconductor device according to a fourth embodiment of the present invention. The major difference of the fourth embodiment from the first, second and third embodiments is that capacitor elements 103 for information storage are formed in a multilayered structure, including a conductive barrier film 114, a capacitance lower electrode 115, an oxide film 116 with a high dielectric constant or a ferrodielectric property, and a capacitance lower electrode 117.

As is well known, the oxide film with a high dielectric constant or a ferrodielectric property does not exhibits favorable characteristics unless subjected to heat treatment, so that it is necessary to perform heat treatment at about 600° C. or higher, preferably at about 700° C. or higher in the production process. Because, during heat treatment, elements tend to diffuse from the gate electrode into the gate dielectric film, it becomes more necessary to inhibit this diffusion in a semiconductor memory that uses an oxide film with a high dielectric constant or ferrodielectric property.

Description will be made of the main structure of a semiconductor device according to the present embodiment. As shown in FIG. 14, the semiconductor device according to the present embodiment comprises a MOS (Metal Oxide Semiconductor) type transistor 102 formed in the active region on a principal surface of a silicon substrate 101, and a information-storage capacitance element 103 disposed on the MOS transistor 102. A dielectric film 112 is an isolation film. The MOS transistor of a memory cell includes a gate electrode film 105, a gate dielectric film 106, and a diffused layer 107. For the gate dielectric film 106, $ZrO_2$ or $HfO_2$ is used as a main material to meet demands for miniaturization and high-level function. This gate dielectric film 106 is formed by CVD, sputtering or the like. When $ZrO_2$ is used as the chief material for the gate electrode, hafnium or titanium is contained as an addition element in the gate dielectric film to inhibit oxygen from diffusing into the silicon substrate or the gate electrodes during heat treatment. Or, when $HfO_2$ is used as the chief material for the gate dielectric film, titanium is contained as an addition element in the gate dielectric film. The gate dielectric film may have a structure of two or more layers as in the second and third embodiments, for example. Preferably, cobalt silicide or silicon is used, which has little tendency to allow oxygen to diffuse through, as the chief material of the gate electrode film 105.

The gate electrode may have a structure of two or more layers as in the third embodiment, for example. This gate electrode film 105 is formed by CVD or sputtering, for example. A dielectric film 109 made of silicon oxide is formed on the top and at the side walls of the gate electrode film 105. A diffused layer 107 of the MOS transistor for selecting a memory cell is connected through a plug 110 to a bit line 111. On the whole top surface of the MOS transistor, a dielectric film 112 is deposited, which is made of, for example, a BPSG (Boron-doped Phospho Silicate Glass) film, a SOG (Spin On Glass) film, or a silicon oxide film or a nitride film formed by CVD or sputtering. The capacitance elements 103 for information storage are formed in an upper portion of the dielectric film 112 that covers the MOS transistors. The capacitance element for information storage is connected to the other diffused layer 108 of each MOS transistor for information storage through a plug 113 made of polysilicon, for example. The capacitance element 103 for information storage has a multilayered structure, including a conductive barrier film 114, a capacitance lower electrode 115, an oxide film 116 with a high dielectric constant, and a capacitance upper electrode 117 in this order mentioned from the bottom layer upward. The chief material used for the oxide film 116 is $ZrO_2$ or $HfO_2$, for example. To inhibit oxygen from diffusing into the capacitance upper electrode or the capacitance lower electrode during heat treatment, when $ZrO_2$ is used as the chief material of the oxide film 116, hafnium or titanium is contained as an addition element in the oxide film 116. Or, when HfO2 is used as the chief material of the oxide film 116, titanium is contained as an addition element in the oxide film 116. The capacitance elements 103 for information storage are covered with a dielectric film 118.

As another embodiment, a system IC may be formed by mounting a memory IC as in the fourth embodiment and a logic IC as in the first, second or third embodiment on the same substrate.

According to the present invention, it is possible to provide a semiconductor device that has high reliability and therefore warrants high yield, and it is also possible to provide a semiconductor device with a gate structure less liable to leakage of current.

What is claimed is:

1. A semiconductor device comprising:
   a semiconductor substrate;
   a gate dielectric film formed of hafnium oxide as a chief material on one surface side of said semiconductor substrate; and
   a gate electrode film formed on said gate dielectric film, wherein said gate dielectric film contains not less than 0.03 at. % and not more than 10 at. % of titanium.

2. A semiconductor device according to claim 1, wherein the chief material of said gate electrode film is cobalt silicide or silicon.

* * * * *